(12) United States Patent
Fujiwara

(10) Patent No.: US 6,188,272 B1
(45) Date of Patent: Feb. 13, 2001

(54) FILTER CIRCUIT

(75) Inventor: Takashi Fujiwara, Yokohama (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/461,397

(22) Filed: Dec. 15, 1999

(30) Foreign Application Priority Data

Dec. 16, 1998 (JP) .................................................. 10-358041

(51) Int. Cl.$^7$ .................................................. H03K 5/00
(52) U.S. Cl. .......................... 327/552; 327/557; 327/558; 330/303; 330/306; 333/172
(58) Field of Search .................................. 327/552, 557, 327/427, 558; 330/303, 306; 333/172

(56) References Cited

U.S. PATENT DOCUMENTS

| | | | |
|---|---|---|---|
| 4,518,878 | * | 5/1985 | Moulding .............................. 327/552 |
| 5,124,666 | * | 6/1992 | Liu et al. .............................. 330/253 |
| 5,572,162 | * | 11/1996 | Cotreau .................................. 327/557 |

OTHER PUBLICATIONS

Mohammed Ismail, et al., "Continuous–Time Signal Processing", Analog VLSI Signal and Information Processing, Primitive Analog Cells, Chapter 3, Sec. 2, pp. 57–63.

* cited by examiner

*Primary Examiner*—Dinh T. Le
(74) *Attorney, Agent, or Firm*—Oblon, Spivak, McClelland, Maier & Neustadt, P.C.

(57) ABSTRACT

Provided is a circuit arrangement for attaining an all-pass filter characteristics which have been conventionally attained by bipolar transistors, by using MIS transistors. An alternating-current signal is input to an input terminal of an inversion circuit having a two-fold amplification function through a low-pass filter. When output from the inversion circuit is input to a gate of a lower transistor of two MIS transistors cascaded and an inverted signal of the alternating-current signal is input to a gate of an upper transistor of the two MIS transistors cascaded, the alternating-current signal is subtracted from the output from the inversion circuit. In this manner, the all-pass filter is formed.

18 Claims, 3 Drawing Sheets

FILTER CIRCUIT

BACKGROUND OF THE INVENTION

The present invention relates to a filter circuit, and particularly to an all-pass filter circuit for use in a delay circuit.

As is known well, filters are classified into a low pass filter (LPF), a high pass filter (HPF) and so forth depending upon which frequency is selected. The low pass filter allows a direct current (DC) signal to a signal having a predetermined frequency to pass through while preventing a signal having more than the predetermined frequency. On the other hand, the high pass filter allows signals having frequencies higher than the predetermined frequency to pass through while preventing signals having frequencies lower than the predetermined frequency.

FIG. 1A shows a low pass filter constituted of the most simple CR (capacitor and resistance). A voltage of FIG. 1A is given by an equation (1)

$$I=(V1-V2)/R=j\omega CV_2 \quad (1)$$

The voltage ratio between input and output is given from the equation (1) as follows:

$$V2/V1=1/(1+j\omega CR) \quad (2)$$

The equation (2) is called a transfer function of the low pass filter.

FIG. 1B is a high pass filter constituted of the most simple CR circuit. The transfer function is similarly given below:

$$V2/V1=j\omega CR/(1+j\omega CR) \quad (3)$$

On the other hand, an all-pass filter (APF) is known. The APF changes a phase or transfer time of a signal without affecting amplitude. This is used for correcting image disturbance due to distortion in phase or delay time in a wave transfer circuit of a TV tuner, VTR and the like. The transfer function is given by an equation (4):

$$V2/V1=(1-j\omega CR)/(1+j\omega CR) \quad (4)$$

In a conventionally-used integrated circuit, all pass filer (APF) is realized by forming an operation amplifier using a bipolar transistor, as shown in FIG. 2. More specifically, signals, (Vin+Vo)/2 and (Vin/(1+j$\omega C_1R_1$) are input to two input ports of an operation amplifier and then output (1-j$\omega C_1R_1$)/(1+j$\omega C_1R_1$) is obtained.

When an analog filter is realized in the recent digitalization trend in electronic appliances, it is a general way to form an integrated circuit having bipolar transistors for realizing the analog filter and MOS transistors for attaining digital processing, in combination. However, a manufacturing process of such an integrated circuit is complicated, thus increasing cost.

BRIEF SUMMARY OF THE INVENTION

An object of the present invention is to attain an all-pass filter constituted of MOS or MIS transistors.

To attain the aforementioned object, the filter circuit according to a first aspect of the present invention comprises:

a first MIS transistor having a first source, a first drain, a first gate, and a channel of one conductivity type;

an input terminal connected to the first gate of the first MIS transistor;

a first power supply terminal connected to the first source of the first MIS transistor;

a second MIS transistor having a second source, a second drain, a second gate, and a channel of the one conductivity type, the second source being connected to the first drain of the first MIS transistor;

a first bias supply circuit connected to the second gate of the second MIS transistor;

a second power supply terminal connected to the second drain of the second MIS transistor;

a third MIS transistor having a third source, a third drain, a third gate, and a channel of the one conductivity type, the third source being connected to the first power supply terminal;

a resistor connected between the third gate of the third MIS transistor and the input terminal;

a capacitor connected between the third gate of the third MIS transistor and the first power supply terminal;

a fourth MIS transistor having a fourth source, a fourth drain, a fourth gate, and a channel of the one conductivity type, the fourth source being connected to the third drain of the third MIS transistor, the fourth drain being connected to the second power supply terminal, and a width/length ratio of the fourth gate being substantially ¼ of that of the third gate of the third MIS transistor;

a second bias supply circuit connected to the fourth gate of the fourth MIS transistor;

a fifth MIS transistor having a fifth source, a fifth drain, a fifth gate, and a channel of the one conductivity type, the fifth source being connected to the first power supply terminal, and the fifth gate being connected to the fourth source of the fourth MIS transistor;

an output terminal connected to the fifth drain of the fifth transistor; and a sixth MIS transistor having a sixth source, a sixth drain, a sixth gate, and a channel of the one conductivity type, the sixth gate being connected to the second source of the second MIS transistor, the sixth source being connected to the fifth drain of the fifth MIS transistor and the output terminal, and the sixth drain being connected to the second power supply terminal.

According to the filter circuit according to a second aspect of the present invention comprises a first MIS transistor having a first source, a first drain, a first gate, and a channel of one conductivity type;

an input terminal connected to the first gate of the first MIS transistor;

a first power supply terminal connected to the first source of the first MIS transistor;

a second MIS transistor having a second source, a second drain, a second gate, and a channel of the one conductivity type, the second source being connected to the first drain of the first MIS transistor;

a first bias supply circuit connected to the second gate of the second MIS transistor;

a second power supply terminal connected to the second drain of the second MIS transistor;

a third MIS transistor having a third source, a third drain, a third gate, and a channel of the one conductivity type, the third source being connected to the first power supply terminal;

a resistor connected between the third gate of the third MIS transistor and the input terminal;

a capacitor connected between the third gate of the third MIS transistor and the first power supply terminal;

a fourth MIS transistor having a fourth source, a fourth drain, a fourth gate, and a channel of the one conductivity type, the fourth gate being connected to the first bias supply circuit, the fourth source being connected to the third drain of the third MIS transistor, and the fourth drain being connected to the second power supply terminal;

a fifth MIS transistor having a fifth source, a fifth drain, a fifth gate, and a channel of the one conductivity type, the fifth source being connected to the first power supply terminal, and the fifth gate being connected to the third gate of the third MIS transistor;

a sixth MIS transistor having a sixth source, a sixth drain, a sixth gate, and a channel of the one conductivity type, the sixth source being connected to the fifth drain of the fifth MIS transistor, the sixth gate being connected to the fourth source of the fourth MIS transistor, and the sixth drain being connected to the second power supply terminal;

a seventh MIS transistor having a seventh source, a seventh drain, a seventh gate, and a channel of the one conductivity type, the seventh source being connected to the first power supply terminal, and the seventh gate being connected to the sixth source of the sixth MIS transistor;

an output terminal connected to the seventh drain of the seventh MIS transistor; and an eighth MIS transistor having an eighth source, an eighth drain, an eighth gate, and a channel of the one conductivity type, the eighth gate being connected to the second source of the second MIS transistor, the eighth source being connected to the seventh drain of the seventh MIS transistor and the output terminal, and the eighth drain being connected to the second power supply terminal.

According to the present invention, the filter characteristics, which are conventionally attained by bipolar transistors, can be easily attained by MOS or MIS transistors. In the conventional method, bipolar transistors and MOS transistors are employed together in a circuit; however, the filter circuit of the present invention can be constituted of MOS transistors alone or MIS transistors alone. Therefore, it is possible to simplify the manufacturing step and reduce the cost.

According to the first aspect of the present invention, an inverting amplifier responsible for two-fold amplification (two-fold amplification inverting amplifier) can be constituted by changing the gate width/length of the transistor at a loading side to ¼. In this case, however, a bias to the amplifier must be controlled in such a way that an operation point for a next stage is not changed. According to the second aspect of the present invention, it is possible to obtain a two-fold amplification rate without changing an operation point for a next stage by adding outputs of two one-fold amplification amplifiers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained with reference to the accompanying drawings.

(First embodiment)

Figure 1A:
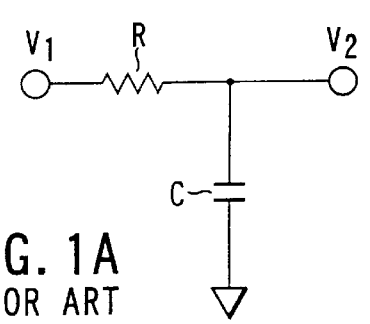
FIGS. 1A and 1B show a low pass filter and a high pass filter constituted of CR, respectively.
Figure 1B:
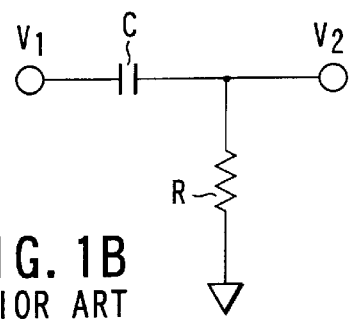
Figure 2:
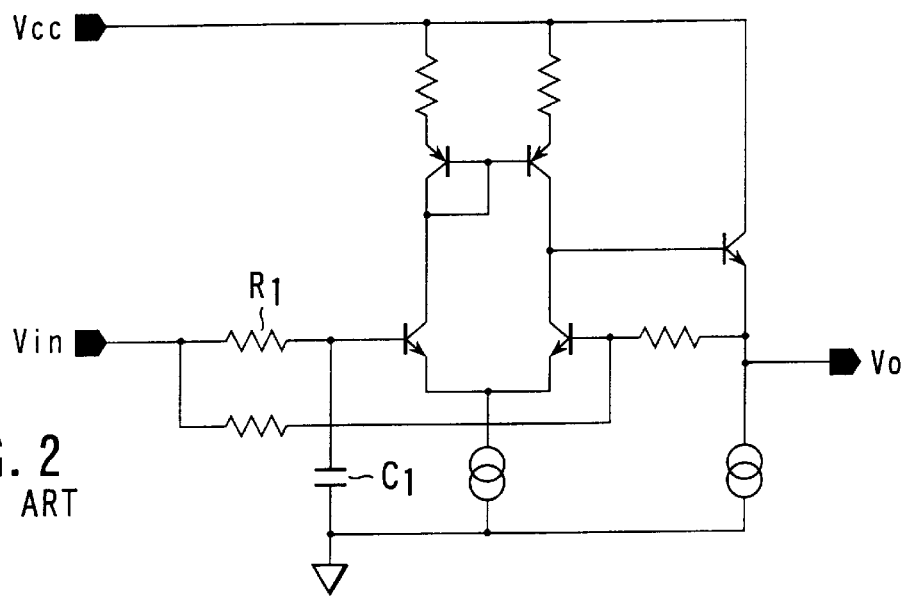
FIG. 2 is an example of a circuit diagram of a conventional all-pass filter constituted of bipolar transistors.
Figure 3:
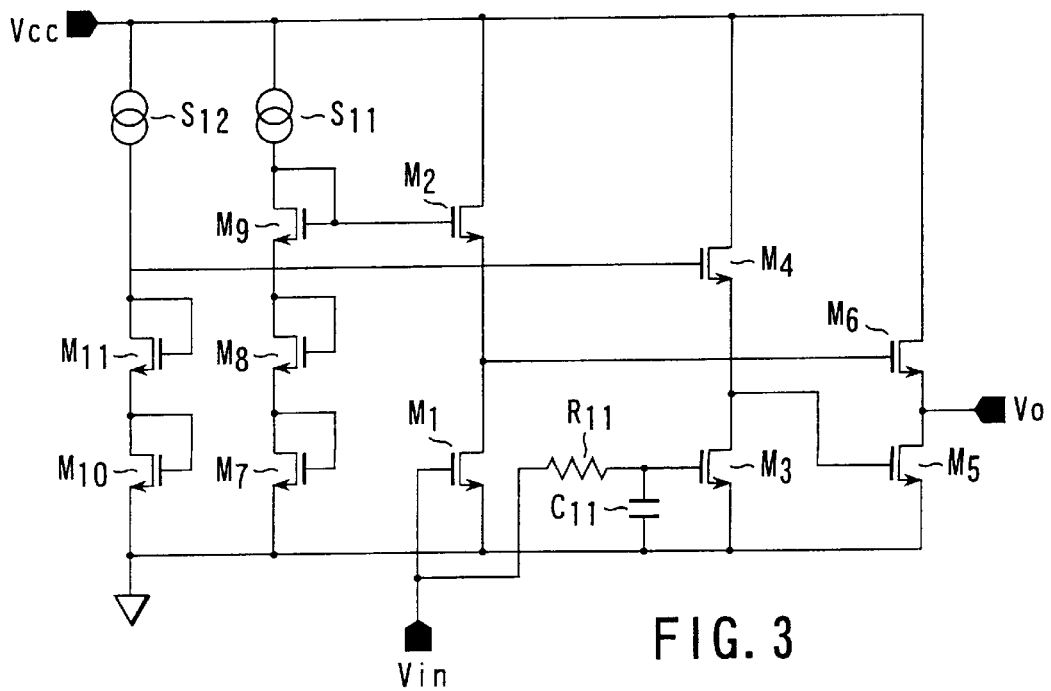
FIG. 3 is a circuit diagram of a filter circuit according to a first embodiment of the present invention.

FIG. 3 is a circuit diagram showing a filter circuit according to the first embodiment. In FIG. 3, an input alternating-current (AC) signal vin is input to the gate of an NMOS transistor M1, and passes through an inverting amplifier constituted of NMOS transistors M1 and M2 to obtain −vin from a source terminal of the transistor M2. The gate of the transistor M2 is connected to a bias circuit constituted of NMOS transistors M7 to M9 and a constant current power supply S11, whereas the source terminal of the transistor M2 is connected to the gate terminal of a transistor M6.

On the other hand, the input AC signal vin passes through a low pass filter (LPF) constituted of a capacitor C11 and a resistor R11 and turns into v1. V1 is represented by the following equation (5):

$$v1 = vin/(1+j\omega C_{11}R_{11}) \tag{5}$$

Output from the LPF is connected to the gate of the transistor M3 and amplified double by an inverting amplifier constituted of transistors M3 and M4. More specifically, the output from the LPF is amplified double by setting a ratio of gate width/gate length of the transistor M4 at ¼ of that of the transistor M3 (desirably, by setting the gate width at ¼ while maintaining the same gate length). An AC signal (−v1)×2 is output from the source terminal of the transistor M4.

The gate of the transistor M4 is connected to a bias circuit constituted of NMOS transistors M10 and M11 and a constant current power supply S12. The source terminal of the transistor M4 is connected to the gate terminal of the transistor M5. Output is obtained from the source terminal of the transistor M6 by an inverting amplifier constituted of the transistors M5 and M6. Since −vin has been input to the gate terminal of the transistor M6, an AC output signal vo obtained from the source terminal of the transistor M6 is given by the following equation (6):

$$vo = -vin + (-v1) \times 2 \times (-1) \tag{6}$$

The input/output transfer function is given by the following equation (7) on the basis of the equations (5) and (6). The transfer function shows that this circuit has APF characteristics.

$$vo/vin = (1-j\omega C_{11}R_{11})/(1+j\omega C_{11}R_{11}) \tag{7}$$

Note that MOS transistors having almost the same voltage-current characteristics are used as MOS transistors M1–M3 and M5–M10. The MOS transistors M1–M11 are each operated at a pentode region.

It is possible to form a two-fold amplification inverting amplifier by changing a gate width/length ratio of the MOS transistor at a loading side to ¼ of that of the MOS transistor at an operation side. However, a bias to the amplifier must be controlled so as not to change an operation point for a next stage by, for example, allowing the voltage-current characteristics of the MOS transistors M4 and M11 to substantially coincide with each other. For the reasons mentioned above, two bias circuits are provided in the circuit shown in FIG. 3.

(Second embodiment)

The second embodiment is the same as the first embodiment except that the NMOS transistors are replaced with PMOS transistors.

Figure 4:
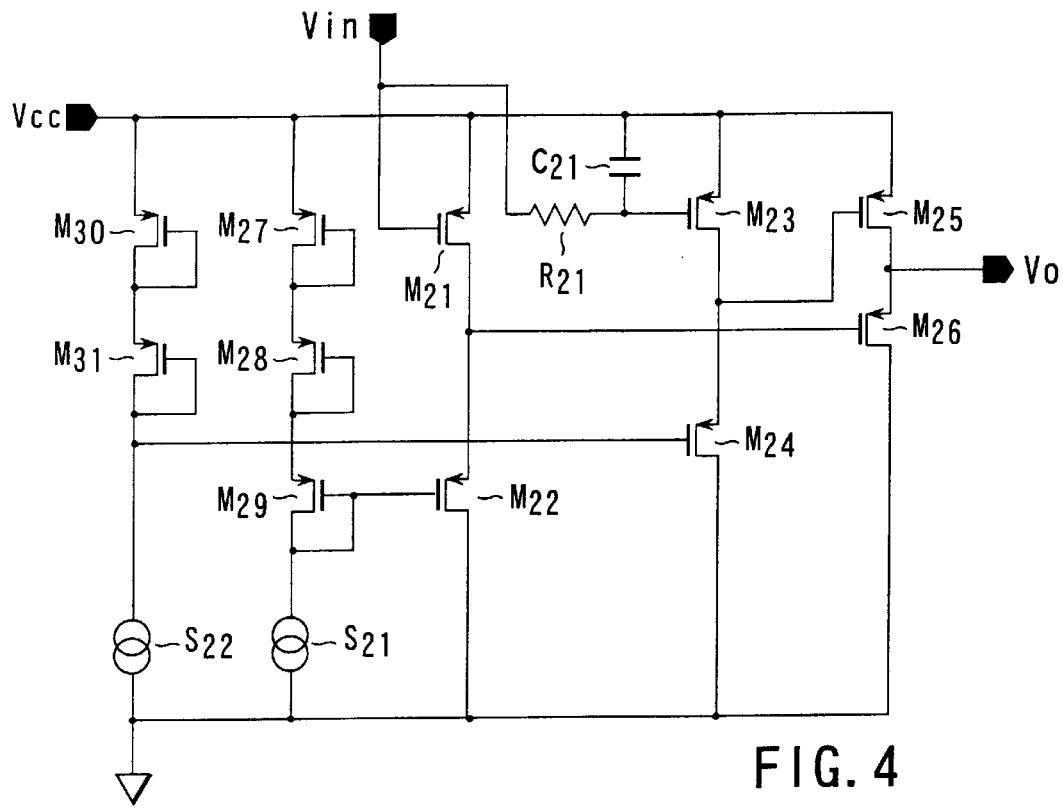
FIG. 4 is a circuit diagram of a filter circuit according to a second embodiment of the present invention.

FIG. 4 is a circuit diagram showing a filter circuit according to the second embodiment of the present invention. In FIG. 4, an input AC signal vin is input to the gate of a PMOS transistor M21, and passes through an inverting amplifier constituted of PMOS transistors M21 and M22 to obtain −vin from a source terminal of the transistor M22. The gate of the transistor M22 is connected to a bias circuit constituted of PMOS transistors M27 to M29 and a constant current power supply S21, whereas the source terminal of the transistor M22 is connected to the gate terminal of a transistor M26.

On the other hand, the input AC signal vin passes through a low pass filter (LPF) constituted of a capacitor C21 and a resistor R21 and turns into v1. V1 is represented by the following equation (8):

$$v1=vin/(1+j\omega C_{21}R_{21}) \tag{8}$$

Output from the LPF is connected to the gate of the transistor M23 and amplified double by an inverting amplifier constituted of transistors M23 and M24. More specifically, the output from the LPF is amplified double by setting a ratio of the gate width/length of the transistor M24 at ¼ of that of the transistor M23 (desirably, by setting the gate width of the transistor M24 at ¼ while maintaining the same gate length). An alternating current signal of (−v1)×2 is output from the source terminal of the transistor M24.

The gate of the transistor M24 is connected to a bias circuit constituted of PMOS transistors M30 and M31 and a constant current power supply S22. The source terminal of the transistor M24 is connected to the gate terminal of the transistor M25. Output is obtained from the source terminal of the transistor M26 by an inverting amplifier constituted of the transistors M25 and M26. Since −vin has been input to the gate terminal of the transistor M26, the AC output signal vo obtained from the source terminal of the transistor M26 is given by the following equation (9):

$$vo=-vin+(-v1)\times 2\times(-1) \tag{9}$$

The input/output transfer function is given by the following equation (10) on the basis of the equations (8) and (9). The transfer function shows that this circuit has APF characteristics.

$$vo/vin=(1-j\omega C_{21}R_{21})/(1+j\omega C_{21}R_{21}) \tag{10}$$

Note that transistors having substantially the same voltage-current characteristics are used as MOS transistors M21–M23 and M25–M30. The MOS transistors of M21–M31 are each operated at a pentode region.

It is possible to form a double-amplification inverting amplifier by changing a gate width/length ratio of the MOS transistor at a loading side to ¼ of that of the MOS transistor at an operation side. However, a bias must be controlled so as not to change an operation point for a next stage by, for example, allowing the voltage-current characteristics of the MOS transistors M24 and M31 to substantially coincide with each other. For the reasons mentioned above, two bias circuits are provided in the circuit shown in FIG. 4.

(Third embodiment)

Figure 5:
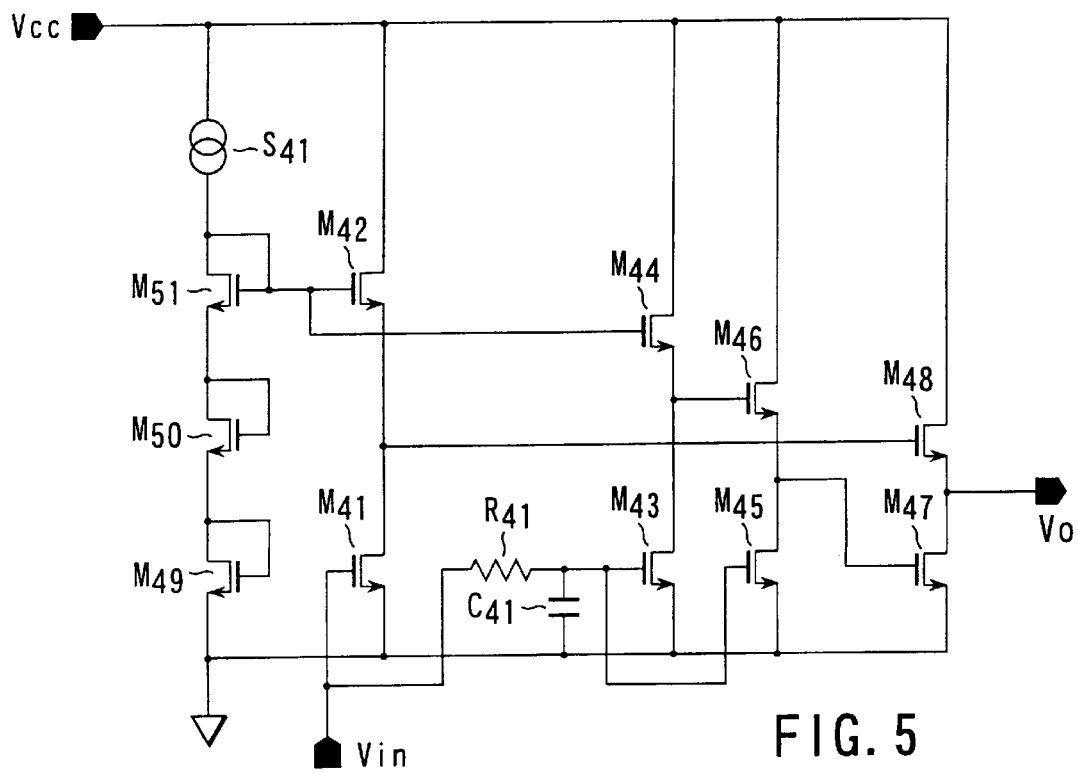
FIG. 5 is a circuit diagram of a filter circuit according to a third embodiment of the present invention.

FIG. 5 is a circuit diagram showing a filter circuit according to the third embodiment. In FIG. 5, an input AC signal vin is input to the gate of an NMOS transistor M41, and passes through an inverting amplifier constituted of NMOS transistors M41 and M42 to obtain −vin from a source terminal of the transistor M42. The gate of the transistor M42 is connected to a bias circuit constituted of NMOS transistors M49 to M51 and a constant current power supply S41, whereas the source terminal of the transistor M42 is connected to the gate terminal of an NMOS transistor M48.

On the other hand, the input alternating-current signal vin passes through a low pass filter (LPF) constituted of a capacitor C41 and a resistor R41 and turns into v1. V1 is represented by the following equation (11):

$$v1=vin/(1+j\omega C_{41}R_{41}) \tag{11}$$

Output from the LPF is connected to the gate terminals of the NMOS transistors M43 and M45 and input to an inverting amplifier constituted of NMOS transistors M43 and M44 and to an inverting amplifier constituted of NMOS transistors M45 and M46. The gate terminal of the transistor M44 is connected to the bias circuit. Since −v1 is output from the source terminal of the transistor M44 and −v1 is input to the gate terminal of the transistor M46, the output v2 from the source terminal of the transistor M46 is given by the following equation (12):

$$v2=-v1+(-v1)=-2\times v1 \tag{12}$$

The source terminal of the transistor M46 is connected to the gate terminal of an NMOS transistor M47 to obtain an inverted signal by an inverting amplifier constituted of NMOS transistors M47 and M48. Since −vin has been input to the gate terminal of the transistor M48, the output signal vo obtained from the source terminal of the transistor M48 is given by the following equation (13):

$$vo=v2+(-vin) \tag{13}$$

The input/output transfer function of this circuit is given by the following equation (14) on the basis of the equations (11), (12) and (13). The transfer function shows that this circuit has APF characteristics.

$$vo/vin=(1-j\omega C_{41}R_{41})/(1+j\omega C_{41}R_{41}) \tag{14}$$

Note that transistors having substantially the same voltage-current characteristics are used as MOS transistors M41–M51. The MOS transistors of M41–M51 are each operated at a pentode region.

(Fourth embodiment)

The fourth embodiment is the same as the third embodiment except that the NMOS transistors are replaced with PMOS transistors.

Figure 6:
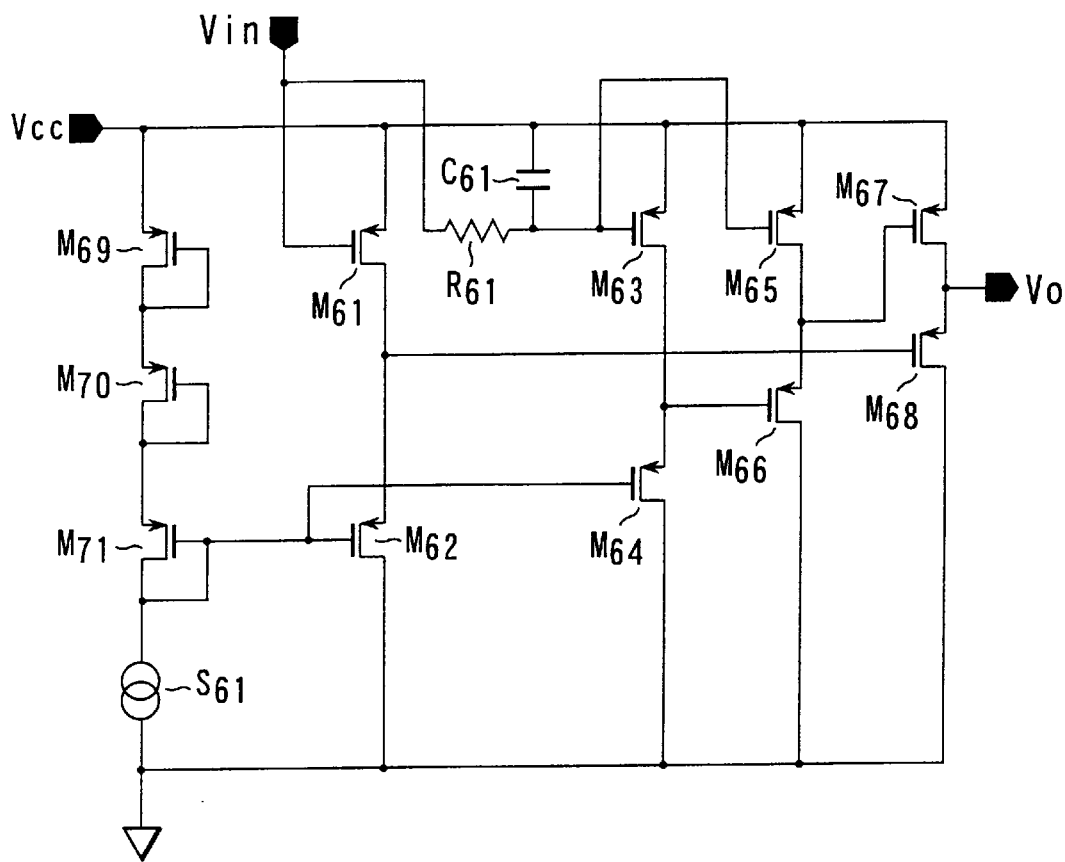
FIG. 6 is a circuit diagram of a filter circuit according to a fourth embodiment of the present invention.

FIG. 6 is a circuit diagram showing a filter circuit according to the fourth embodiment of the present invention. In FIG. 6, an input AC signal vin is input to a gate of a PMOS transistor M61, and passes through an inverting amplifier constituted of PMOS transistors M61 and M62 to obtain −vin from a source terminal of the transistor M62. The gate terminal of the transistor M62 is connected to a bias circuit constituted of PMOS transistors M69 to M71 and a constant current power supply S61, whereas the source terminal of the transistor M62 is connected to the gate terminal of a PMOS transistor M68.

On the other hand, the input AC signal vin passes through a low pass filter (LPF) constituted of a capacitor C61 and resistor R61 and turns into v1. V1 is represented by the following equation (15):

$$V1=vin/(1+j\omega C_{61}R_{61}) \quad (15)$$

Output from the LPF is connected to the gate terminals of PMOS transistors M63 and M65 and input to an inverting amplifier constituted of PMOS transistors M63 and M64 and to an inverting amplifier constituted of PMOS transistors M65 and M66. The gate terminal of the transistor M64 is connected to a bias circuit. Since −v1 is output from the source terminal of the transistor M64 and −v1 is input to the gate terminal of the transistor M66, the output v2 from the source terminal of the transistor M66 is given by the following equation (16):

$$v2=-v1 +(-v1)=-2\times v1 \quad (16)$$

The source terminal of the transistor M66 is connected to the gate terminal of a PMOS transistor M67.

An inverted signal −v2 is obtained by an inverting amplifier constituted of PMOS transistors M67 and M68. Since −vin has been input to the gate terminal of the transistor M68, the output signal vo obtained from the source terminal of the transistor M68 is given by the following equation (17):

$$vo=-v2 +(-vin) \quad (17)$$

The input/output transfer function is given by the following equation (18) on the basis of the equations (15), (16) and (17). The transfer function shows that this circuit has APF characteristics.

$$vo/vin=(1-j\omega C_{61}R_{61})/(1+j\omega C_{61}R_{61}) \quad (18)$$

Note that transistors having substantially the same voltage-current characteristics are used as MOS transistors M61–M71. The MOS transistors of M61–M71 are each operated at a pentode region.

The first to fourth embodiments have been explained by taking a MOS transistor as example. MIS transistors using various dielectrics including silicon oxide as a gate dielectric, may be used in place of the MOS transistors.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A filter circuit comprising:

a first MIS transistor having a first source, a first drain, a first gate, and a channel of one conductivity type;

an input terminal connected to the first gate of the first MIS transistor;

a first power supply terminal connected to the first source of the first MIS transistor;

a second MIS transistor having a second source, a second drain, a second gate, and a channel of the one conductivity type, the second source being connected to the first drain of the first MIS transistor;

a first bias supply circuit connected to the second gate of the second MIS transistor;

a second power supply terminal connected to the second drain of the second MIS transistor;

a third MIS transistor having a third source, a third drain, a third gate, and a channel of the one conductivity type, the third source being connected to the first power supply terminal;

a resistor connected between the third gate of the third MIS transistor and the input terminal;

a capacitor connected between the third gate of the third MIS transistor and the first power supply terminal;

a fourth MIS transistor having a fourth source, a fourth drain, a fourth gate, and a channel of the one conductivity type, the fourth source being connected to the third drain of the third MIS transistor, the fourth drain being connected to the second power supply terminal, and a width/length ratio of the fourth gate being substantially ¼ of that of the third gate of the third MIS transistor;

a second bias supply circuit connected to the fourth gate of the fourth MIS transistor;

a fifth MIS transistor having a fifth source, a fifth drain, a fifth gate, and a channel of the one conductivity type, the fifth source being connected to the first power supply terminal, and the fifth gate being connected to the fourth source of the fourth MIS transistor;

an output terminal connected to the fifth drain of the fifth transistor; and a sixth MIS transistor having a sixth source, a sixth drain, a sixth gate, and a channel of the one conductivity type, the sixth gate being connected to the second source of the second MIS transistor, the sixth source being connected to the fifth drain of the fifth MIS transistor and the output terminal, and the sixth drain being connected to the second power supply terminal.

2. The filter circuit according to claim 1, wherein a length of the fourth gate is approximately equal to that of the third gate and a width of the fourth gate is substantially ¼ of that of the third gate.

3. The filter circuit according to claim 1, wherein the first bias supply circuit comprises a first current source one terminal of which is connected to the second power supply terminal;

a seventh MIS transistor having a seventh source, a seventh drain, a seventh gate, and a channel of the one conductivity type, the seventh source being connected to the first power supply terminal, and the seventh drain and the seventh gate being connected to each other;

an eighth MIS transistor having an eighth source, an eighth drain, an eighth gate, and a channel of the one conductivity type, the eighth source being connected to the seventh drain of the seventh MIS transistor, and the eighth drain and the eighth gate being connected to each other; and a ninth MIS transistor having a ninth source, a ninth drain, a ninth gate, and a channel of the one conductivity type, the ninth source being connected to the eighth drain of the eighth MIS transistor, and the ninth drain and the ninth gate being connected to each other and further connected to the other terminal of the first current source, wherein a node connecting the ninth drain and the ninth gate of the ninth MIS transistor is an output node of the first bias supply circuit; and the second bias supply circuit comprises a second current source one terminal of which is connected to the second power supply terminal;

a tenth MIS transistor having a tenth source, a tenth drain, a tenth gate, and a channel of the one conductivity type, the tenth source being connected to the first power supply terminal, and the tenth drain and the tenth gate being connected to each other; and an eleventh MIS transistor having an eleventh source, an eleventh drain, an eleventh gate, and a channel of the one conductivity type, the eleventh source being connected to the tenth drain of the tenth MIS transistor, and the eleventh drain and the eleventh gate being connected to each other and further connected to the other terminal of the second current source, wherein a node connecting the eleventh drain and the eleventh gate of the eleventh MIS transistor is an output node of the second bias supply circuit.

4. The filter circuit according to claim 3, wherein voltage-current characteristics of the first to the third, the fifth to the tenth MIS transistor substantially coincide with each other, and voltage-current characteristics of the fourth MIS transistor and the eleventh MIS transistor substantially coincide with each other.

5. The filter circuit according to claim 3, wherein each of the first to the eleventh MIS transistor functions in a pentode region.

6. A filter circuit comprising:

a first MIS transistor having a first source, a first drain, a first gate, and a channel of one conductivity type;

an input terminal connected to the first gate of the first MIS transistor;

a first power supply terminal connected to the first source of the first MIS transistor;

a second MIS transistor having a second source, a second drain, a second gate, and a channel of the one conductivity type, the second source being connected to the first drain of the first MIS transistor;

a first bias supply circuit connected to the second gate of the second MIS transistor;

a second power supply terminal connected to the second drain of the second MIS transistor;

a third MIS transistor having a third source, a third drain, a third gate, and a channel of the one conductivity type, the third source being connected to the first power supply terminal;

a resistor connected between the third gate of the third MIS transistor and the input terminal;

a capacitor connected between the third gate of the third MIS transistor and the first power supply terminal;

a fourth MIS transistor having a fourth source, a fourth drain, a fourth gate, and a channel of the one conductivity type, the fourth gate being connected to the first bias supply circuit, the fourth source being connected to the third drain of the third MIS transistor, and the fourth drain being connected to the second power supply terminal;

a fifth MIS transistor having a fifth source, a fifth drain, a fifth gate, and a channel of the one conductivity type, the fifth source being connected to the first power supply terminal, and the fifth gate being connected to the third gate of the third MIS transistor;

a sixth MIS transistor having a sixth source, a sixth drain, a sixth gate, and a channel of the one conductivity type, the sixth source being connected to the fifth drain of the fifth MIS transistor, the sixth gate being connected to the fourth source of the fourth MIS transistor, and the sixth drain being connected to the second power supply terminal;

a seventh MIS transistor having a seventh source, a seventh drain, a seventh gate, and a channel of the one conductivity type, the seventh source being connected to the first power supply terminal, and the seventh gate being connected to the sixth source of the sixth MIS transistor;

an output terminal connected to the seventh drain of the seventh MIS transistor; and an eighth MIS transistor having an eighth source, an eighth drain, an eighth gate, and a channel of the one conductivity type, the eighth gate being connected to the second source of the second MIS transistor, the eighth source being connected to the seventh drain of the seventh MIS transistor and the output terminal, and the eighth drain being connected to the second power supply terminal.

7. The filter circuit according to claim 6, wherein the first bias supply circuit comprises a current source one terminal of which is connected to the second power supply terminal;

a ninth MIS transistor having a ninth source, a ninth drain, a ninth gate, and a channel of the one conductivity type, the ninth source being connected to the first power supply terminal, and the ninth drain and the ninth gate being connected to each other;

a tenth MIS transistor having a tenth source, a tenth drain, a tenth gate, and a channel of the one conductivity type, the tenth source being connected the ninth drain of the ninth MIS transistor, and the tenth drain and the tenth gate being connected to each other; and an eleventh MIS transistor having an eleventh source, an eleventh drain, an eleventh gate, and a channel of the one conductivity type, the eleventh source being connected to the tenth drain of the tenth MIS transistor, and the eleventh drain and the eleventh gate being connected to each other, and further connected to the other terminal of the current source, wherein a node connecting the eleventh drain and the eleventh gate of the eleventh MIS transistor is an output node of the first bias supply circuit.

8. The filter circuit according to claim 7, wherein voltage-current characteristics of the first to the eleventh MIS transistor substantially coincide with each other.

9. The filter circuit according to claim 7, wherein each of the first to the eleventh MIS transistor functions in a pentode region.

10. A filter circuit comprising:

a first MIS transistor having a first source, a first drain, a first gate, and a channel of one conductivity type;

an input terminal connected to the first gate of the first MIS transistor;

a first power supply terminal connected to the first source of the first MIS transistor;

a second MIS transistor having a second source, a second drain, a second gate, and a channel of the one conductivity type, the second source being connected to the first drain of the first MIS transistor;

a first bias supply circuit connected to the second gate of the second MIS transistor;

a second power supply terminal connected to the second drain of the second MIS transistor;

a third MIS transistor having a third source, a third drain, a third gate, and a channel of the one conductivity type, the third source being connected to the first power supply terminal;

a low pass filter connected between the third gate of the third MIS transistor and the input terminal;

a fourth MIS transistor having a fourth source, a fourth drain, a fourth gate, and a channel of the one conductivity type, the fourth source being connected to the third drain of the third MIS transistor, the fourth drain being connected to the second power supply terminal, and a width/length ratio of the fourth gate being substantially ¼ of that of the third gate of the third MIS transistor;

a second bias supply circuit connected to the fourth gate of the fourth MIS transistor;

a fifth MIS transistor having a fifth source, a fifth drain, a fifth gate, and a channel of the one conductivity type, the fifth source being connected to the first power supply terminal, and the fifth gate being connected to the fourth source of the fourth MIS transistor;

an output terminal connected to the fifth drain of the fifth transistor; and a sixth MIS transistor having a sixth source, a sixth drain, a sixth gate, and a channel of the one conductivity type, the sixth gate being connected to the second source of the second MIS transistor, the sixth source being connected to the fifth drain of the fifth MIS transistor and the output terminal, and the sixth drain being connected to the second power supply terminal.

11. The filter circuit according to claim 10, wherein a length of the fourth gate is approximately equal to that of the third gate and a width of the fourth gate is substantially ¼ of that of the third gate.

12. The filter circuit according to claim 10, wherein the first bias supply circuit comprises a first current source one terminal of which is connected to the second power supply terminal;

a seventh MIS transistor having a seventh source, a seventh drain, a seventh gate, and a channel of the one conductivity type, the seventh source being connected to the first power supply terminal, and the seventh drain and the seventh gate being connected to each other;

an eighth MIS transistor having an eighth source, an eighth drain, an eighth gate, and a channel of the one conductivity type, the eighth source being connected to the seventh drain of the seventh MIS transistor, and the eighth drain and the eighth gate being connected to each other; and a ninth MIS transistor having a ninth source, a ninth drain, a ninth gate, and a channel of the one conductivity type, the ninth source being connected to the eighth drain of the eighth MIS transistor, and the ninth drain and the ninth gate being connected to each other and further connected to the other terminal of the first current source, wherein a node connecting the ninth drain and the ninth gate of the ninth MIS transistor is an output node of the first bias supply circuit; and the second bias supply circuit comprises a second current source one terminal of which is connected to the second power supply terminal;

a tenth MIS transistor having a tenth source, a tenth drain, a tenth gate, and a channel of the one conductivity type, the tenth source being connected to the first power supply terminal, and the tenth drain and the tenth gate being connected to each other; and an eleventh MIS transistor having an eleventh source, an eleventh drain, an eleventh gate, and a channel of the one conductivity type, the eleventh source being connected to the tenth drain of the tenth MIS transistor, and the eleventh drain and the eleventh gate being connected to each other and further connected to the other terminal of the second current source, wherein a node connecting the eleventh drain and the eleventh gate of the eleventh MIS transistor is an output node of the second bias supply circuit.

13. The filter circuit according to claim 12, wherein voltage-current characteristics of the first to the third, the fifth to the tenth MIS transistor substantially coincide with each other, and voltage-current characteristics of the fourth MIS transistor and the eleventh MIS transistor substantially coincide with each other.

14. The filter circuit according to claim 12, wherein each of the first to the eleventh MIS transistor functions in a pentode region.

15. A filter circuit comprising:

a first MIS transistor having a first source, a first drain, a first gate, and a channel of one conductivity type;

an input terminal connected to the first gate of the first MIS transistor;

a first power supply terminal connected to the first source of the first MIS transistor;

a second MIS transistor having a second source, a second drain, a second gate, and a channel of the one conductivity type, the second source being connected to the first drain of the first MIS transistor;

a first bias supply circuit connected to the second gate of the second MIS transistor;

a second power supply terminal connected to the second drain of the second MIS transistor;

a third MIS transistor having a third source, a third drain, a third gate, and a channel of the one conductivity type, the third source being connected to the first power supply terminal;

a low pass filter connected between the third gate of the third MIS transistor and the input terminal;

a fourth MIS transistor having a fourth source, a fourth drain, a fourth gate, and a channel of the one conductivity type, the fourth gate being connected to the first bias supply circuit, the fourth source being connected to the third drain of the third MIS transistor, and the fourth drain being connected to the second power supply terminal;

a fifth MIS transistor having a fifth source, a fifth drain, a fifth gate, and a channel of the one conductivity type, the fifth source being connected to the first power supply terminal, and the fifth gate being connected to the third gate of the third MIS transistor;

a sixth MIS transistor having a sixth source, a sixth drain, a sixth gate, and a channel of the one conductivity type, the sixth source being connected to the fifth drain of the fifth MIS transistor, the sixth gate being connected to the fourth source of the fourth MIS transistor, and the sixth drain being connected to the second power supply terminal;

a seventh MIS transistor having a seventh source, a seventh drain, a seventh gate, and a channel of the one conductivity type, the seventh source being connected to the first power supply terminal, and the seventh gate being connected to the sixth source of the sixth MIS transistor;

an output terminal connected to the seventh drain of the seventh MIS transistor; and an eighth MIS transistor having an eighth source, an eighth drain, an eighth gate, and a channel of the one conductivity type, the eighth gate being connected to the second source of the second MIS transistor, the eighth source being connected to the seventh drain of the seventh MIS transistor and the output terminal, and the eighth drain being connected to the second power supply terminal.

16. The filter circuit according to claim 15, wherein the first bias supply circuit comprises a current source one terminal of which is connected to the second power supply terminal;

a ninth MIS transistor having a ninth source, a ninth drain, a ninth gate, and a channel of the one conductivity type, the ninth source being connected to the first power supply terminal, and the ninth drain and the ninth gate being connected to each other;

a tenth MIS transistor having a tenth source, a tenth drain, a tenth gate, and a channel of the one conductivity type, the tenth source being connected the ninth drain of the ninth MIS transistor, and the tenth drain and the tenth gate being connected to each other; and an eleventh MIS transistor having an eleventh source, an eleventh drain, an eleventh gate, and a channel of the one conductivity type, the eleventh source being connected to the tenth drain of the tenth MIS transistor, and the eleventh drain and the eleventh gate being connected to each other, and further connected to the other terminal of the current source, wherein a node connecting the eleventh drain and the eleventh gate of the eleventh MIS transistor is an output node of the first bias supply circuit.

17. The filter circuit according to claim 16, wherein voltage-current characteristics of the first to the eleventh MIS transistor substantially coincide with each other.

18. The filter circuit according to claim 16, wherein each of the first to the eleventh MIS transistor functions in a pentode region.

* * * * *